United States Patent
Kim et al.

(10) Patent No.: US 11,927,881 B2
(45) Date of Patent: Mar. 12, 2024

(54) PELLICLE FOR EXTREME ULTRAVIOLET LITHOGRAPHY BASED ON YTTRIUM CARBIDE

(71) Applicant: KOREA ELECTRONICS TECHNOLOGY INSTITUTE, Seongnam-si (KR)

(72) Inventors: Hyeong Keun Kim, Yongin-si (KR); Seul Gi Kim, Yongin-si (KR); Hyun Mi Kim, Seoul (KR); Jin Woo Cho, Seoul (KR); Ki Hun Seong, Anyang-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 149 days.

(21) Appl. No.: 17/456,839

(22) Filed: Nov. 29, 2021

(65) Prior Publication Data

US 2023/0125229 A1 Apr. 27, 2023

(30) Foreign Application Priority Data

Oct. 25, 2021 (KR) .......................... 10-2021-0142410

(51) Int. Cl.
*G03F 1/64* (2012.01)
*G03F 1/62* (2012.01)
*G03F 7/11* (2006.01)
*G03F 7/20* (2006.01)

(52) U.S. Cl.
CPC .................. *G03F 1/62* (2013.01); *G03F 7/11* (2013.01); *G03F 7/2004* (2013.01)

(58) Field of Classification Search
CPC ..................................... G03F 1/62; G03F 1/64
See application file for complete search history.

(56) References Cited

U.S. PATENT DOCUMENTS

2020/0406244 A1* 12/2020 Kurganova .............. B01J 27/22

FOREIGN PATENT DOCUMENTS

| JP | 2020-098227 A | 6/2020 | |
|---|---|---|---|
| KR | 10-2018-0072786 A | 6/2018 | |
| KR | 10-18787330 B1 | 7/2018 | |
| KR | 10-2018-0135490 A | 12/2018 | |
| KR | 10-2019-0053706 A | 5/2019 | |
| KR | 10-2020-0112756 A | 10/2020 | |
| KR | 10-2020-0126216 A | 11/2020 | |
| WO | WO-2017122975 A1 * | 7/2017 | ............... G03F 1/22 |

OTHER PUBLICATIONS

Office Action dated Apr. 22, 2021 in Korean Application No. 10-2020-0148420.
Office Action dated Apr. 21, 2021 in Korean Application No. 10-2020-0149813.
Notice of Allowance dated Jul. 19, 2021 in Korean Application No. 10-2020-0149813.

\* cited by examiner

*Primary Examiner* — Martin J Angebranndt
(74) *Attorney, Agent, or Firm* — Knobbe Martens Olson & Bear LLP

(57) ABSTRACT

A pellicle for extreme ultraviolet (EUV) lithography is based on yttrium carbide and used in a EUV lithography process. The pellicle for EUV lithography includes a pellicle layer that has a core layer containing yttrium carbide. The yttrium carbide is $YC_x$ in which the atomic percentage of carbon is within a range of 25% to 45%.

20 Claims, 7 Drawing Sheets

PELLICLE FOR EXTREME ULTRAVIOLET LITHOGRAPHY BASED ON YTTRIUM CARBIDE

CROSS-REFERENCE TO RELATED APPLICATION

The present application claims priority to Korean Patent Application No. 10-2021-0142410 filed on Oct. 25, 2021 in the Korean Intellectual Property Office, which is incorporated herein in its entirety by reference.

BACKGROUND

Technical Field

The present disclosure relates to an extreme ultraviolet (EUV) lithography apparatus, and more particularly, to a EUV lithography pellicle based on yttrium carbide and installed on a mask in a EUV lithography process.

Description of Related Technology

As the semiconductor industry continues to develop and the degree of semiconductor integration is dramatically improved, electronic devices are becoming smaller and lighter. In order to further improve the degree of semiconductor integration, the advancement of lithography technology is required.

Currently, technology is developing toward realizing a fine pattern of a semiconductor by reducing the wavelength of a light source. Extreme ultraviolet (EUV) lithography technology, recently developed as a next-generation technology, can realize a fine pattern through a single resist process.

SUMMARY

Accordingly, the present disclosure provides a pellicle for extreme ultraviolet lithography based on yttrium carbide and having an extreme ultraviolet transmittance of 90% or more in an extreme ultraviolet output environment of 350 W or more.

In addition, the present disclosure provides a pellicle for extreme ultraviolet lithography based on yttrium carbide and having thermal stability, mechanical stability, and chemical durability while having a high extreme ultraviolet transmittance of 90% or more.

According to embodiments of the present disclosure, a pellicle for extreme ultraviolet lithography may include a pellicle layer including a core layer containing yttrium carbide, wherein the yttrium carbide is $YC_x$ in which an atomic percentage of carbon is within a range of 25% to 45%.

The yttrium carbide may include $Y_2C$.

The yttrium carbide may include $\gamma\text{-}YC_x$ exhibiting a stable phase of $Y_2C$ as a temperature increases.

The yttrium carbide may be $YC_x$ in which the atomic percentage of carbon is within a range of 29% to 34%.

The pellicle layer may include the core layer, and a capping layer formed on one or both surfaces of the core layer, wherein a material of the capping layer includes at least one of $Y_2C$, Y, Si, Ru, C, B, N, and O.

The material of the capping layer may include $YC_xSi_y$ (x+y≥0.5), $YC_xB_y$ (x+y≥1), $YSi_xN_y$ (x+y≥1), $YC_xN_y$ (x+y≥1), $YC_x$ (x≥0.5), $YB_x$ (x≥1), $YSi_x$ (x≥0.5), $YN_x$ (x≥1), $SiN_x$ (x≥1), $SiO_2$, $B_4C$, or Ru.

The material of the capping layer may be a Y-α material (α is at least one of Si, Ru, C, B, N, and O), and may have a composition different from a composition of the core layer.

The pellicle layer may include the core layer, an intermediate layer formed on one or both surfaces of the core layer, and a capping layer formed on the intermediate layer, wherein materials of the intermediate layer and the capping layer include at least one of $Y_2C$, Y, Si, Ru, C, B, N, and O.

The materials of the intermediate layer and the capping layer may include $YC_xSi_y$ (x+y≥0.5), $YC_xB_y$ (x+y≥1), $YSi_xN_y$ (x+y≥1), $YC_xN_y$ (x+y≥1), $YC_x$ (x≥0.5), $YB_x$ (x≥1), $YSi_x$ (x≥0.5), $YN_x$ (x≥1), $SiN_x$ (x≥1), $SiO_2$, $B_4C$, or Ru.

The materials of the intermediate layer and the capping layer may be Y-α materials (α is at least one of Si, Ru, C, B, N, and O), and may have compositions different from a composition of the core layer.

According to embodiments of the present disclosure, a pellicle for extreme ultraviolet lithography may include a substrate having an opening formed in a central portion thereof, and a pellicle layer including a core layer containing yttrium carbide and formed on the substrate to cover the opening, wherein the yttrium carbide is $YC_x$ in which the atomic percentage of carbon is within a range of 25% to 45%.

According to the present disclosure, by forming the core layer of yttrium carbide ($YC_x$ in which the atomic percentage of carbon is within a range of 25% to 45%), it is possible to provide a pellicle for extreme ultraviolet lithography having a high extreme ultraviolet transmittance of 90% or more in an extreme ultraviolet output environment of 350 W or more while having thermal stability, mechanical stability, and chemical durability. That is, by using yttrium carbide containing yttrium (Y), which has a high melting point and excellent chemical resistance and mechanical properties, as the core layer of the pellicle, it is possible to provide the pellicle not only having thermal stability, mechanical stability, and chemical durability, but also having a high extreme ultraviolet transmittance of 90% or more in an extreme ultraviolet output environment of 350 W or more.

Of yttrium carbide used as the core layer, $Y_2C$ maintains a stable γ-phase even at a temperature of 900° C. or higher. Therefore, using $Y_2C$ as a material of the core layer can provide thermal stability in an extreme ultraviolet environment.

In addition, of yttrium carbide used as the core layer, $YC_x$ in which the atomic percentage of carbon is within a range of 25% to 45% maintains a stable γ-phase close to $Y_2C$ even near 1400° C., so using $YC_x$ in which the atomic percentage of carbon is within a range of 25% to 45% as a material of the core layer can provide thermal stability in an extreme ultraviolet environment.

Also, by forming the core layer of yttrium carbide in which the atomic percentage of carbon is within a range of 25% to 45%, it is possible to provide a high extreme ultraviolet transmittance of 90% or more in an extreme ultraviolet output environment of 350 W or more even if the intermediate layer is formed to a thickness of 10 nm.

DETAILED DESCRIPTION

An extreme ultraviolet lithography apparatus used in a semiconductor process includes a light source power, a resist, a pellicle, and a mask. The pellicle is installed on the mask to prevent contaminants generated during the lithography process from adhering to the mask, and is selectively used depending on the lithography apparatus.

In the extreme ultraviolet lithography process, there was an expectation that the pellicle would not be needed because a clean system was built. However, it has been known that during an actual operation after the construction of the lithography apparatus, contamination of the mask is caused by foreign substances generated from an internal driving unit of the apparatus, particles of tin generated in the oscillation of the light source, and extreme ultraviolet photoresist.

Therefore, in the extreme ultraviolet lithography process, the pellicle is recognized as an essential component so as to prevent contamination of the mask. When the pellicle is used, defects smaller than 10,000 nm in size are negligible.

The pellicle for extreme ultraviolet lithography is required to have a size of 110 mm×144 mm to cover the mask, and an extreme ultraviolet transmittance of 90% or more is required in order to minimize deterioration of productivity due to loss of a light source. In addition, mechanical stability that the pellicle is not damaged by physical movement up to 20G inside the extreme ultraviolet lithography apparatus, and thermal stability that the pellicle can withstand a thermal load of 250 W or more based on a 5 nm node are required.

Also, chemical durability that the pellicle does not react to hydrogen radicals generated in an extreme ultraviolet environment is required.

Currently, pellicle development companies are developing transmissive materials based on polycrystalline silicon (p-Si) or SiN. However, such materials do not satisfy a transmittance of 90% or more, which is the most important condition of a pellicle for extreme ultraviolet lithography. Also, such materials have weaknesses in thermal stability, mechanical stability, and chemical durability in an extreme ultraviolet lithography environment, so that process development research is being conducted to supplement their properties. For example, materials such as Mo, Ru, and Zr have been selected and studied as materials for solving the problems of SiN-based materials, but it is difficult to manufacture a thin film and maintain its shape.

In addition, recently, a pellicle having an extreme ultraviolet transmittance of 90% or more and thermal, chemical and mechanical stability in an extreme ultraviolet output environment of 350 W or more beyond an irradiation intensity of 250 W is required.

Hereinafter, embodiments of the present disclosure will be described in detail with reference to the accompanying drawings. The present disclosure may, however, be embodied in many different forms and should not be construed as being limited to the embodiment set forth herein. Rather, this embodiment is provided so that the disclosure will be thorough and complete and will fully convey the scope of the disclosure to those skilled in the art. Accordingly, an embodiment described herein should be understood to include various modifications, equivalents, and/or alternatives.

In addition, techniques that are well known in the art and not directly related to the present disclosure are not described herein. This is to clearly convey the subject matter of the present disclosure by omitting an unnecessary explanation. Also, the terms are merely used for describing a particular embodiment but do not limit the embodiment. Singular forms are intended to include plural forms unless the context clearly indicates otherwise.

First Embodiment

Figure 1:
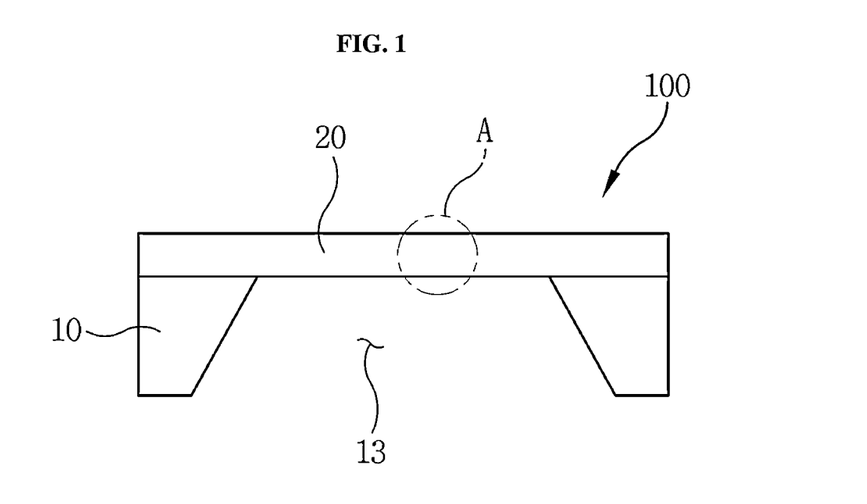
FIG. 1 is a cross-sectional view showing a pellicle for extreme ultraviolet lithography based on yttrium carbide according to a first embodiment of the present disclosure.
Figure 2:
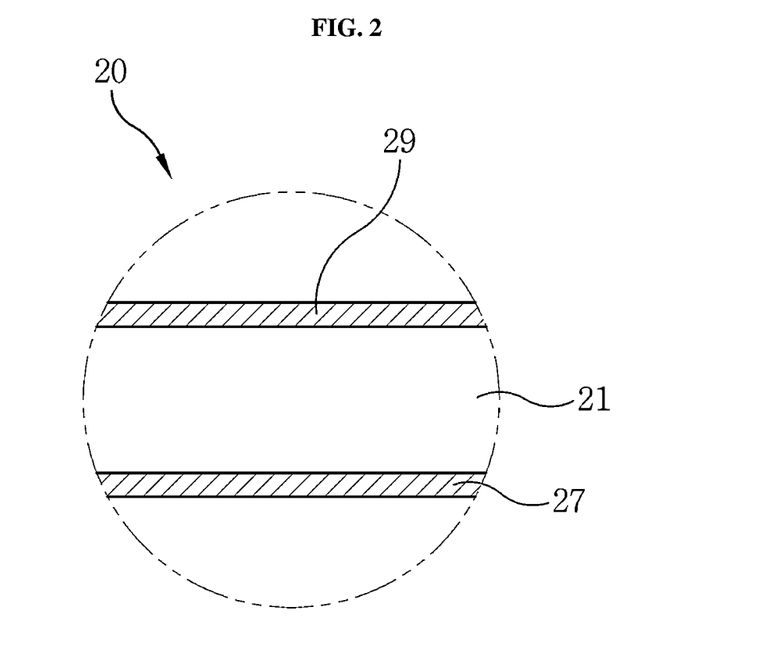
FIG. 2 is an enlarged view showing a portion 'A' of FIG. 1.

FIG. 1 is a cross-sectional view showing a pellicle for extreme ultraviolet lithography based on yttrium carbide according to a first embodiment of the present disclosure. FIG. 2 is an enlarged view showing a portion 'A' of FIG. 1.

Referring to FIGS. 1 and 2, a pellicle 100 for extreme ultraviolet lithography according to the first embodiment (hereinafter referred to as 'pellicle') includes a substrate 10 having an opening 13 formed in a central portion thereof, and a pellicle layer 20 formed on the substrate 10 so as to cover the opening 13 and having a core layer 21 containing yttrium carbide. The yttrium carbide is $YC_x$ and the atomic percentage of carbon is within a range of 25% to 45%.

The pellicle layer 20 may include the core layer 21 and capping layers 27 and 29, which are stacked on the substrate 10. The capping layers 27 and 29 may be formed on one or both surfaces of the core layer 21.

The pellicle 100 is a consumable component that protects a mask from contaminants in a lithography process for semiconductor or display manufacturing. That is, the pellicle 100 is a thin film overlying the mask and serves as a cover. Because the light transferred to the wafer is focused with the mask in a lithographic exposure, even if contaminants exist on the pellicle 100 that is separated by a certain distance, it is possible to minimize a problem of forming a defective pattern due to out of focus.

As such, the pellicle 100 may minimize defective patterns while protecting the mask from contaminants during the exposure process, thereby greatly increasing the yield of semiconductor or display manufacturing. In addition, the use of the pellicle 100 can increase the lifespan of the mask.

Now, the pellicle 100 according to the first embodiment will be described in detail.

The substrate 10 supports the pellicle layer 20 and makes it easy to handle and transport the pellicle 100 during and after the process of manufacturing the pellicle 100. The substrate 10 may be formed of a material available for an etching process. The material of the substrate 10 includes, for example, but is not limited to, silicon, silicon oxide, silicon nitride, metal oxide, metal nitride, graphite, amorphous carbon, or a stack structure thereof. Here, the metal may be, but is not limited to, Cr, Al, Zr, Ti, Ta, Nb, Ni, or the like.

The opening 13 in the central portion of the substrate 10 may be formed using a micro-machining technique such as micro-electro mechanical systems (MEMS). That is, the opening 13 is formed by removing the central portion of the substrate 10 by means of the micro-machining technique. The opening 13 partially exposes the pellicle layer 20.

As mentioned above, the pellicle layer 20 includes the core layer 21 and the capping layers 27 and 29.

The core layer 21 is a layer that determines the transmittance of extreme ultraviolet rays. The core layer 21 has a transmittance of 90% or more for extreme ultraviolet rays, and effectively dissipates heat to prevent overheating of the pellicle layer 20.

The core layer 21 is formed of yttrium carbide represented by $YC_x$ in which the atomic percentage of carbon is within a range of 25% to 45%. Preferably, the core layer 21 may be formed of yttrium carbide represented by $YC_x$ in which the atomic percentage of carbon is within a range of 29% to 34%.

By using yttrium carbide that contains yttrium (Y) having a high melting point and excellent chemical resistance and mechanical properties as the core layer 21, it is possible to provide the pellicle 100 having thermal stability, mechanical stability, and chemical durability while having a high extreme ultraviolet transmittance of 90% or more in an extreme ultraviolet output environment of 350 W or more.

Figure 3:
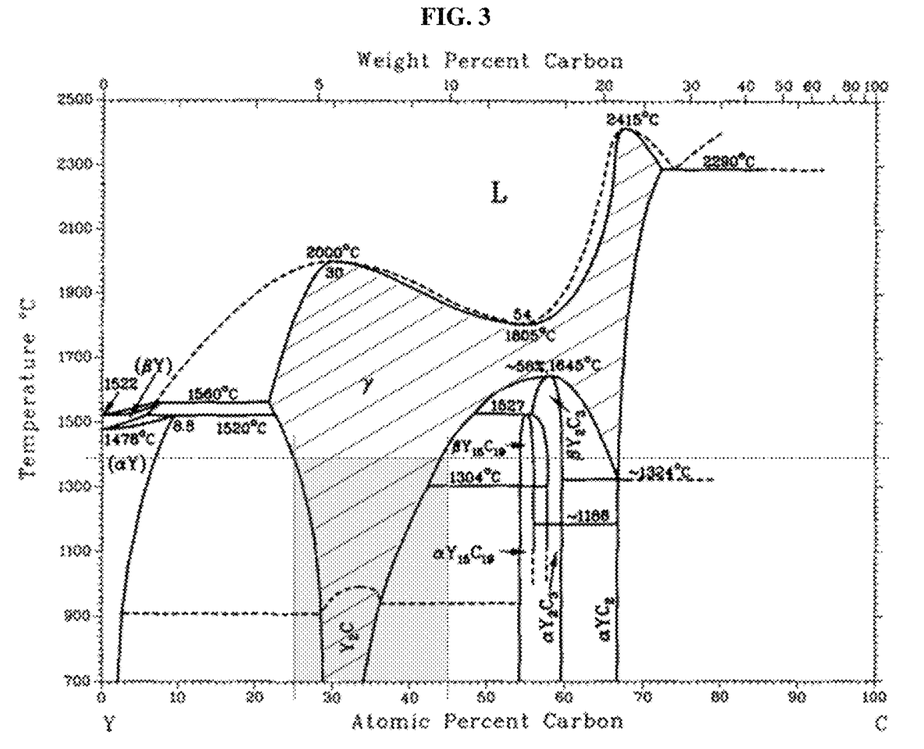
FIG. 3 is a phase diagram of $YC_x$ used as a material of the core layer shown in FIG. 1.

Yttrium carbide has a phase diagram as shown in FIG. 3. The $YC_x$ used as the core layer 21 is as follows.

Of yttrium carbide, $Y_2C$ maintains a stable γ-phase even at a temperature of 900° C. or higher. Therefore, using $Y_2C$ as a material of the core layer 21 can provide thermal stability in an extreme ultraviolet environment.

Of yttrium carbide, $YC_x$ in which the atomic percentage of carbon is within a range of 25% to 45% maintains a stable γ-phase close to $Y_2C$ even near 1400° C., so using $YC_x$ in which the atomic percentage of carbon is within a range of 25% to 45% as a material of the core layer 21 can provide thermal stability in an extreme ultraviolet environment. $YC_x$ (in which the atomic percentage of carbon is within a range of 25% to 45%) having a stable γ-phase close to $Y_2C$ is expressed as $γ-YC_x$.

In general, the maximum temperature of the pellicle 100 is about 1400° C., and it can be seen that $γ-YC_x$, even if it is not an $Y_2C$ composition, converges to the $Y_2C$ stable phase as the temperature increases.

It is shown that $Y_2C$ is distributed over a wide area according to temperature. This means that it is easy to control because of maintaining an original phase compared to other phases of yttrium carbide when considering the thermal properties of the pellicle 100. For example, in case of $Y_2C$ at 700° C. (atomic percent (at %) basis), it can be seen that the $Y_2C$ stable phase does not change even if carbon has any atomic percent within the range of 29 to 34 at %, and the allowable range increases as the temperature increases. That is, the core layer 21 can be formed of yttrium carbide represented by $YC_x$ in which the atomic percentage of carbon is within a range of 29% to 34%.

However, in case of $α-YC_2$ which does not belong to $YC_x$ in which the atomic percentage of carbon is within a range of 25% to 45%, the phase cannot be maintained if it is out of the composition of Y:C=1:2. In addition, the atomic percent required depending on the temperature is difficult to control because it must be controlled along a line rather than a range.

When $Y_2C$ or $γ-YC_x$ is used as the material of the core layer 21, it can be seen that excellent optical properties are exhibited when compared with the stable phase of yttrium carbide having a composition different from that of the first embodiment. This will be described in experimental examples below.

Meanwhile, the capping layers 27 and 29 provide thermal stability, mechanical stability, and chemical durability to the pellicle layer 20 while minimizing a decrease in the extreme ultraviolet transmittance of the core layer 21. That is, the capping layers 27 and 29, as protective layers for the core layer 21, provide thermal stability by effectively dissipating heat generated in the core layer 21 to the outside. In addition, the capping layers 27 and 29 provide mechanical stability by supplementing the mechanical strength of the core layer 21. In addition, the capping layers 27 and 29 provide chemical durability by protecting the core layer 21 from hydrogen radicals and oxidation.

The capping layers 27 and 29 may be formed on one or both surfaces of the core layer 21. The capping layers 27 and 29 according to the first embodiment include a first capping layer 27 formed on a lower surface of the core layer 21, and a second capping layer 29 formed on an upper surface of the core layer 21.

The first capping layer 27 is interposed between the substrate 10 and the core layer 21, is formed of a material having resistance to KOH, and prevents the material of the core layer 21 from diffusing into the substrate 10.

The material of the first and second capping layers 27 and 29 includes at least one of $Y_2C$, Y, Si, Ru, C, B, N and O. For example, the material of the first and second capping layers 27 and 29 may include $YC_xSi_y$ (x+y≥0.5), $YC_xB_y$ (x+y≥1), $YSi_xN_y$ (x+y≥1), $YC_xN_y$ (x+y≥1), $YC_x$ (x≥0.5), $YB_x$ (x≥1), $YSi_x$ (x≥0.5), $YN_x$ (x≥1), $SiN_x$ (x≥1), $SiO_2$, $B_4C$, or Ru.

$YSi_xC_y$ may include, but is not limited to, $Y_{20}Si_{12}C$.

$YB_xC_y$ may include, but is not limited to, $Y_2B_3C_2$, $Y(BC)_2$, or $YB_2C$.

$YSi_xN_y$ may include, but is not limited to, $Y_3Si_6N_{11}$.

$YC_xN_y$ may include, but is not limited to, $Y_2(CN_2)_3$.

$YC_x$ may include, but is not limited to, $Y_2C$, $Y_2C_3$, $Y_3C_4$, $Y_4C_7$, or $YC_2$.

$YSi_x$ may include, but is not limited to, $Y_5Si_3$, YSi, or $YSi_2$.

$YB_x$ may include, but is not limited to, $YB_2$, $YB_4$, $YB_6$, or $YB_{12}$.

The material of the first and second capping layers 27 and 29 is a Y-α material (α is at least one of Si, Ru, C, B, N, and O), and may have a composition different from that of the core layer 21.

The reason for using at least one of $Y_2C$, Y, Si, Ru, C, B, N, and O as the material of the first and second capping layers 27 and 29 is as follows. In a conventional pellicle, it was necessary to form the capping layer to a thickness of 5 nm or less in order to ensure a high extreme ultraviolet transmittance. However, by using at least one of $Y_2C$, Y, Si, Ru, C, B, N, and O as the material of the first and second capping layers 27 and 29, it is possible to provide the pellicle 100 having thermal stability, mechanical stability, and chemical durability while having a high extreme ultraviolet transmittance of 90% or more even if the first and second capping layers 27 and 29 are formed to have a thickness of 10 nm.

As such, the pellicle 100 according to the first embodiment including yttrium carbide as the core layer 21 not only has a high extreme ultraviolet transmittance of 90% or more, but also provides thermal stability, mechanical stability, and chemical durability.

The pellicle 100 according to the first embodiment may be manufactured by the following manufacturing process. First, the pellicle layer 20 is formed by sequentially stacking the first capping layer 27, the core layer 21, and the second capping layer 29 on the substrate 10 in a state where the opening 13 is not formed.

At this time, each of the first capping layer 27, the core layer 21, and the second capping layer 29 may be formed by a chemical vapor deposition (CVD) process, an atomic layer deposition (ALD) process, an e-beam evaporation process, or a sputtering process.

Then, the central portion of the substrate 10 under the pellicle layer 20 is removed to form the opening 13 through which the lower surface of the pellicle layer 20 is partially exposed. As a result, the pellicle 100 according to the first embodiment is obtained. Specifically, the opening 13 may be formed by removing the central portion of the substrate 10 under the first capping layer 27 through wet etching. Then, the first capping layer 27 is exposed through the opening 13.

Second Embodiment

Figure 4:
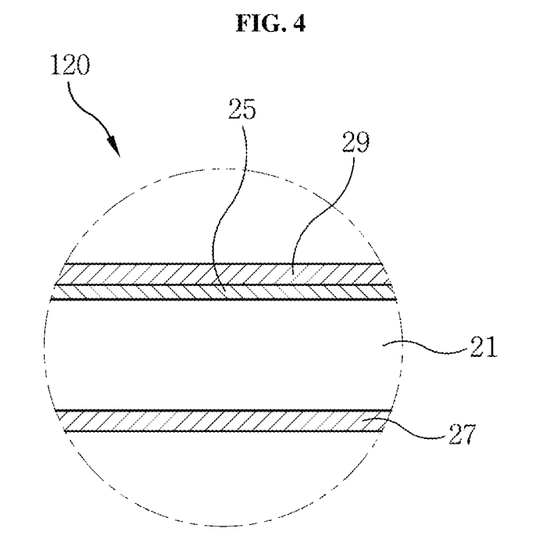
FIG. 4 is an enlarged view showing a pellicle for extreme ultraviolet lithography based on yttrium carbide according to a second embodiment of the present disclosure.

FIG. 4 is an enlarged view showing a pellicle for extreme ultraviolet lithography based on yttrium carbide according to a second embodiment of the present disclosure.

Referring to FIG. 4, the pellicle according to the second embodiment includes the above-described substrate (10 in FIG. 1) having the opening (13 in FIG. 1) formed in the central portion thereof, and a pellicle layer 120 formed on the substrate 10 to cover the opening 13 and having the core layer 21 containing yttrium carbide. The yttrium carbide is $YC_x$ in which the atomic percentage of carbon is within a range of 25% to 45%.

The pellicle layer 120 may include the core layer 21, an intermediate layer 25, and the capping layers 27 and 29, which are stacked on the substrate 10. Each of the intermediate layer 25 and the capping layers 27 and 29 may be formed on one or both surfaces of the core layer 21.

The pellicle according to the second embodiment has the same structure as the pellicle (100 in FIG. 1) according to the first embodiment except that the intermediate layer 25 is added.

The core layer 21 is formed of yttrium carbide represented by $YC_x$ in which the atomic percentage of carbon is within a range of 25% to 45%. Preferably, the core layer 21 may be formed of yttrium carbide represented by $YC_x$ in which the atomic percentage of carbon is within a range of 29% to 34%. The core layer 21 is the same as the core layer according to the first embodiment, so a detailed description thereof will be omitted.

The capping layers 27 and 29 include the first capping layer 27 formed on the lower surface of the core layer 21, and the second capping layer 29 formed on the upper surface of the core layer 21.

The material of the first and second capping layers 27 and 29 includes at least one of $Y_2C$, Y, Si, Ru, C, B, N and O. For example, the material of the first and second capping layers 27 and 29 may include $YC_xSi_y$ (x+y≥0.5), $YC_xB_y$ (x+y≥1), $YSi_xN_y$ (x+y≥1), $YC_xN_y$ (x+y≥1), $YC_x$ (x≥0.5), $YB_x$ (x≥1), $YSi_x$ (x≥0.5), $YN_x$ (x≥1), $SiN_x$ (x≥1), $SiO_2$, $B_4C$, or Ru.

The material of the first and second capping layers 27 and 29 is a Y-α material (α is at least one of Si, Ru, C, B, N, and O), and may have a composition different from that of the core layer 21.

The intermediate layer 25 is interposed between the core layer 21 and the capping layers 27 and 29. The intermediate layer 25 acts as a protective layer to relieve thermal stress due to thermal expansion and also prevent diffusion. The intermediate layer 25 may also act as a buffer layer to increase a bonding force between the core layer 21 and each of the capping layers 27 and 29. The intermediate layer 25 according to the second embodiment is an example of being formed between the core layer 21 and the second capping layer 29.

The material of the intermediate layer 25 includes at least one of $Y_2C$, Y, Si, Ru, C, B, N and O. For example, the material of the intermediate layer 25 may include $YC_xSi_y$ (x+y≥0.5), $YC_xB_y$ (x+y≥1), $YSi_xN_y$ (x+y≥1), $YC_xN_y$ (x+y≥1), $YC_x$ (x≥0.5), $YB_x$ (x≥1), $YSi_x$ (x≥0.5), $YN_x$ (x≥1), $SiN_x$ (x≥1), $SiO_2B_4C$, or Ru.

The material of the intermediate layer 25 is a Y-α material (α is at least one of Si, Ru, C, B, N, and O), and may have a composition different from that of the core layer 21.

As such, the pellicle according to the second embodiment including the core layer 21 formed of yttrium carbide not only has a high extreme ultraviolet transmittance of 90% or more, but also provides thermal stability, mechanical stability, and chemical durability.

The pellicle according to the second embodiment may be manufactured by the following manufacturing process. First, the pellicle layer 120 is formed by sequentially stacking the first capping layer 27, the core layer 21, the intermediate layer 25, and the second capping layer 29 on the substrate in a state where the opening is not formed.

At this time, each of the first capping layer 27, the core layer 21, the intermediate layer 25, and the second capping layer 29 may be formed by a CVD process, an ALD process, an e-beam evaporation process, or a sputtering process.

Then, the central portion of the substrate under the pellicle layer 120 is removed to form the opening through which the lower surface of the pellicle layer 120 is partially exposed. As a result, the pellicle according to the second embodiment is obtained. Specifically, the opening may be formed by removing the central portion of the substrate under the first capping layer 27 through wet etching. Then, the first capping layer 27 is exposed through the opening.

Third Embodiment

Figure 5:
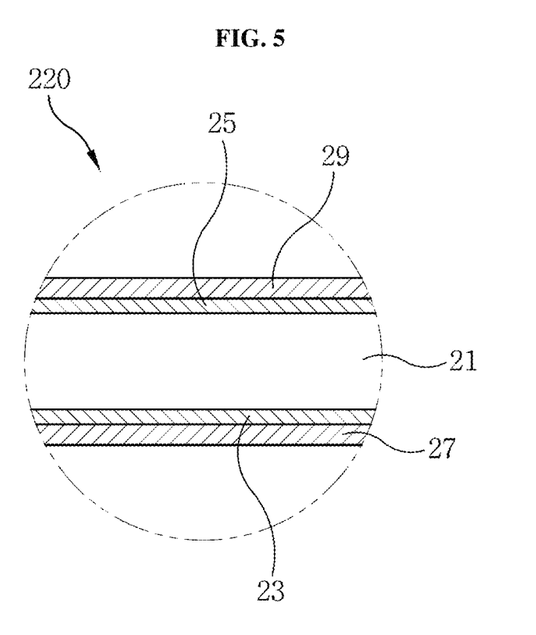
FIG. 5 is an enlarged view showing a pellicle for extreme ultraviolet lithography based on yttrium carbide according to a third embodiment of the present disclosure.

FIG. 5 is an enlarged view showing a pellicle for extreme ultraviolet lithography based on yttrium carbide according to a third embodiment of the present disclosure.

Referring to FIG. 5, the pellicle according to the third embodiment includes the above-described substrate (10 in FIG. 1) having the opening (13 in FIG. 1) formed in the central portion thereof, and a pellicle layer 220 formed on the substrate 10 to cover the opening 13 and having the core layer 21 containing yttrium carbide. The yttrium carbide is $YC_x$ in which the atomic percentage of carbon is within a range of 25% to 45%.

The pellicle layer 120 may include the core layer 21, intermediate layers 23 and 25, and the capping layers 27 and 29, which are stacked on the substrate 10.

The pellicle according to the third embodiment has the same structure as the pellicle (100 in FIG. 1) according to the first embodiment except that the intermediate layers 23 and 25 are added.

The core layer 21 is formed of yttrium carbide represented by $YC_x$ in which the atomic percentage of carbon is within a range of 25% to 45%. Preferably, the core layer 21 may be formed of yttrium carbide represented by $YC_x$ in which the atomic percentage of carbon is within a range of 29% to 34%. The core layer 21 is the same as the core layer according to the first embodiment, so a detailed description thereof will be omitted.

The capping layers 27 and 29 include the first capping layer 27 formed on the lower surface of the core layer 21, and the second capping layer 29 formed on the upper surface of the core layer 21.

The material of the first and second capping layers 27 and 29 includes at least one of $Y_2C$, Y, Si, Ru, C, B, N and O. For example, the material of the first and second capping layers 27 and 29 may include $YC_x Si_y$ (x+y≥0.5), $YC_x B_y$ (x+y≥1), $YSi_x N_y$ (x+y≥1), $YC_x N_y$ (x+y≥1), $YC_x$ (x≥0.5), $YB_x$ (x≥1), $YSi_x$ (x≥0.5), $YN_x$ (x≥1), $SiN_x$ (x≥1), $SiO_2$, $B_4C$, or Ru.

The material of the first and second capping layers 27 and 29 is a Y-α material (α is at least one of Si, Ru, C, B, N, and O), and may have a composition different from that of the core layer 21.

The intermediate layers 23 and 25 are interposed between the core layer 21 and the capping layers 27 and 29. The intermediate layers 23 and 25 act as protective layers to relieve thermal stress due to thermal expansion and also prevent diffusion. The intermediate layers 23 and 25 may also act as buffer layers to increase a bonding force between the core layer 21 and the capping layers 27 and 29. The intermediate layers 23 and 25 according to the third embodiment includes a first intermediate layer 23 formed between the core layer 21 and the first capping layer 27, and a second intermediate layer 25 formed between the core layer 21 and the second capping layer 29.

The material of the first and second intermediate layers 23 and 25 includes at least one of $Y_2C$, Y, Si, Ru, C, B, N and O. For example, the material of the first and second intermediate layers 23 and 25 may include $YC_x Si_y$ (x+y≥0.5), $YC_x B_y$ (x+y≥1), $YSi_x N_y$ (x+y≥1), $YC_x N_y$ (x+y≥1), $YC_x$ (x≥0.5), $YB_x$ (x≥1), $YSi_x$ (x≥0.5), $YN_x$ (x≥1), $SiN_x$ (x≥1), $SiO_2$, $B_4C$, or Ru.

The material of the first and second intermediate layers 23 and 25 is a Y-α material (α is at least one of Si, Ru, C, B, N, and O), and may have a composition different from that of the core layer 21.

As such, the pellicle according to the third embodiment including the core layer 21 formed of yttrium carbide not only has a high extreme ultraviolet transmittance of 90% or more, but also provides thermal stability, mechanical stability, and chemical durability.

The pellicle according to the third embodiment may be manufactured by the following manufacturing process. First, the pellicle layer 220 is formed by sequentially stacking the first capping layer 27, the first intermediate layer 23, the core layer 21, the second intermediate layer 25, and the second capping layer 29 on the substrate in a state where the opening is not formed.

At this time, each of the first capping layer 27, the first intermediate layer 23, the core layer 21, the second intermediate layer 25, and the second capping layer 29 may be formed by a CVD process, an ALD process, an e-beam evaporation process, or a sputtering process.

Then, the central portion of the substrate under the pellicle layer 220 is removed to form the opening through which the lower surface of the pellicle layer 220 is partially exposed. As a result, the pellicle according to the third embodiment is obtained. Specifically, the opening may be formed by removing the central portion of the substrate under the first capping layer 27 through wet etching. Then, the first capping layer 27 is exposed through the opening.

EXPERIMENTAL EXAMPLES

In order to confirm the transmittance and reflectance of the pellicle according to the present disclosure in an extreme ultraviolet output environment of 350 W or more, simulations were performed on the pellicles according to first to fourth experimental examples as shown in FIGS. 6 to 9.

The pellicles according to the first to fourth experimental examples include the pellicle layer according to the first embodiment. That is, the pellicle layer includes the first capping layer, the core layer (Layer 2), and the second capping layer (Layer 1). The material of the first and second capping layers is $SiN_x$. The material of the core layer is $Y_2C$.

When the thickness of the first capping layer is 3 nm ($1^{st}$ experiment example), 4 nm ($2^{nd}$ experiment example), 5 nm ($3^{rd}$ experiment example), or 6 nm ($4^{th}$ experiment example), the transmittance and reflectance of the pellicle in an extreme ultraviolet output environment of 350 W were simulated in the first to fourth experimental examples while changing the thickness of the core layer to 0 to 50 nm and the thickness of the second capping layer to 0 to 10 nm.

First Experimental Example

Figure 6:
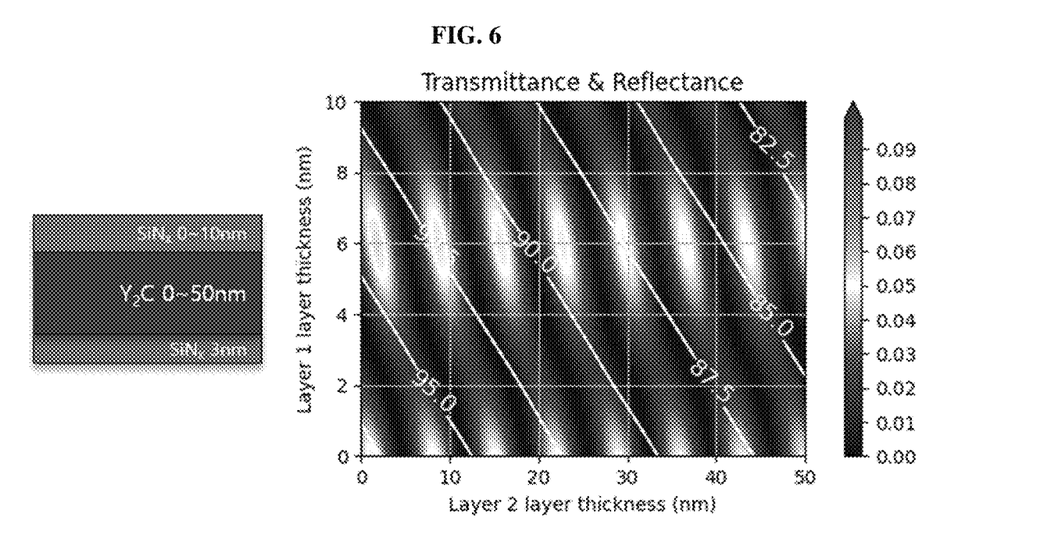
FIG. 6 is a graph showing transmittance and reflectance of a pellicle for extreme ultraviolet lithography based on yttrium carbide according to a first experimental example of the present disclosure.

FIG. 6 is a graph showing transmittance and reflectance of a pellicle for extreme ultraviolet lithography based on yttrium carbide according to a first experimental example of the present disclosure.

Referring to FIG. 6, it can be seen that the pellicle according to the first experimental example has a transmittance of 90% or more and a reflectance of 0.04% or less under the following conditions.

That is, when the thickness of the core layer is 28 nm or less and the thickness of the second capping layer is 2 to 4 nm, it can be seen that the transmittance is 90% or more and the reflectance is 0.04% or less.

In addition, when the thickness of the core layer is 13 nm or less and the thickness of the second capping layer is 8 to 10 nm, it can be seen that the transmittance is 90% or more and the reflectance is 0.04% or less.

Second Experimental Example

Figure 7:
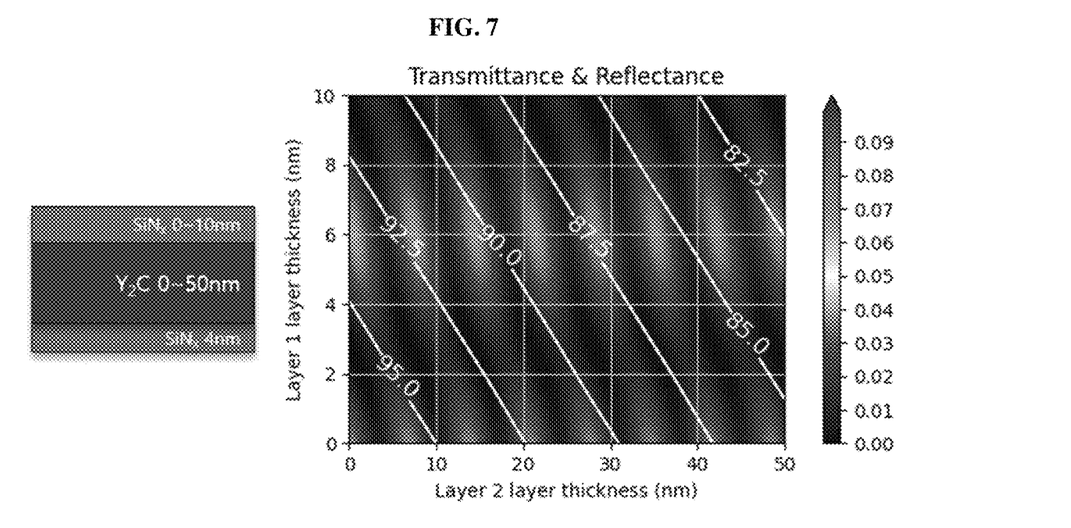
FIG. 7 is a graph showing transmittance and reflectance of a pellicle for extreme ultraviolet lithography based on yttrium carbide according to a second experimental example of the present disclosure.

FIG. 7 is a graph showing transmittance and reflectance of a pellicle for extreme ultraviolet lithography based on yttrium carbide according to a second experimental example of the present disclosure.

Referring to FIG. 7, it can be seen that the pellicle according to the second experimental example has a transmittance of 90% or more and a reflectance of 0.04% or less under the following conditions.

That is, when the thickness of the core layer is 28 nm or less and the thickness of the second capping layer is 1 to 4 nm, it can be seen that the transmittance is 90% or more and the reflectance is 0.04% or less.

In addition, when the thickness of the core layer is 11 nm or less and the thickness of the second capping layer is 7 to 10 nm, it can be seen that the transmittance is 90% or more and the reflectance is 0.04% or less.

Third Experimental Example

Figure 8:
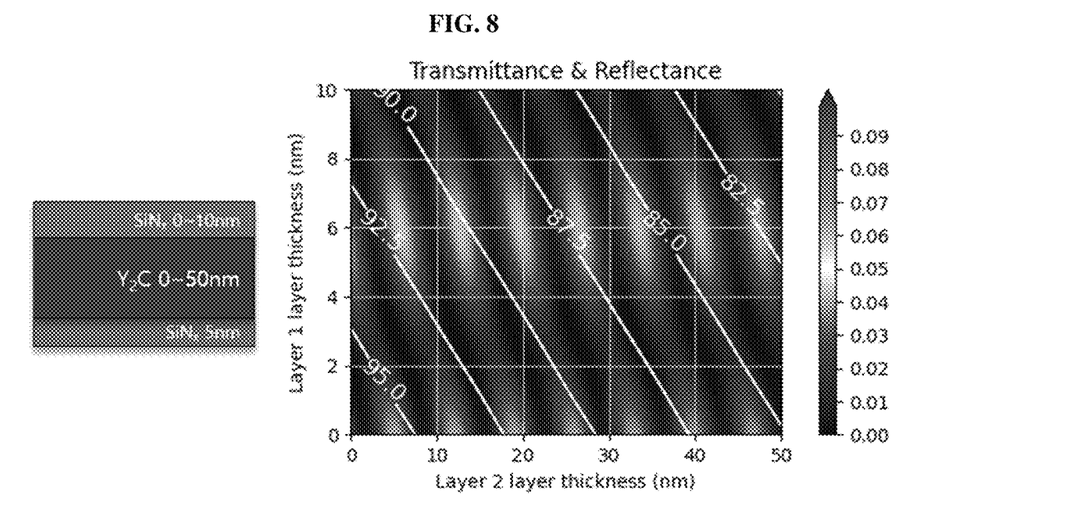
FIG. 8 is a graph showing transmittance and reflectance of a pellicle for extreme ultraviolet lithography based on yttrium carbide according to a third experimental example of the present disclosure.

FIG. 8 is a graph showing transmittance and reflectance of a pellicle for extreme ultraviolet lithography based on yttrium carbide according to a third experimental example of the present disclosure.

Referring to FIG. 8, it can be seen that the pellicle according to the third experimental example has a transmittance of 90% or more and a reflectance of 0.04% or less under the following conditions.

That is, when the thickness of the core layer is 25 nm or less and the thickness of the second capping layer is 1 to 4 nm, it can be seen that the transmittance is 90% or more and the reflectance is 0.04% or less.

In addition, when the thickness of the core layer is 9 nm or less and the thickness of the second capping layer is 8 to 10 nm, it can be seen that the transmittance is 90% or more and the reflectance is 0.04% or less.

Fourth Experimental Example

Figure 9:
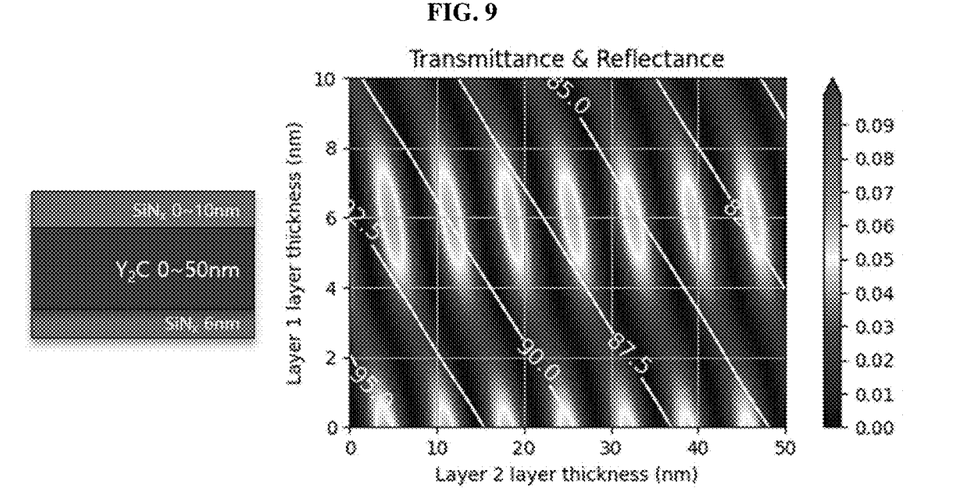
FIG. 9 is a graph showing transmittance and reflectance of a pellicle for extreme ultraviolet lithography based on yttrium carbide according to a fourth experimental example of the present disclosure.

FIG. 9 is a graph showing transmittance and reflectance of a pellicle for extreme ultraviolet lithography based on yttrium carbide according to a fourth experimental example of the present disclosure.

Referring to FIG. 9, it can be seen that the pellicle according to the fourth experimental example has a transmittance of 90% or more and a reflectance of 0.04% or less under the following conditions.

That is, when the thickness of the core layer is 20 nm or less and the thickness of the second capping layer is 2 to 4 nm, it can be seen that the transmittance is 90% or more and the reflectance is 0.04% or less.

In addition, when the thickness of the core layer is 5 nm or less and the thickness of the second capping layer is 9 to 10 nm, it can be seen that the transmittance is 90% or more and the reflectance is 0.04% or less.

As such, according to the first to fourth experimental examples, when the core layer is formed of $Y_2C$, a high extreme ultraviolet transmittance of 90% or more can be provided even if the thickness of the second capping layer is formed to a maximum of nm.

COMPARATIVE EXAMPLES

In order to confirm that the pellicle according to the present disclosure has good transmittance and reflectance in an extreme ultraviolet output environment of 350 W or more, simulations were performed on the pellicles according to first to fourth comparative examples as shown in FIGS. 10 to 13.

The pellicles according to the first to fourth comparative examples have the same structure as the pellicle according to the first embodiment. That is, the pellicle layer includes the first capping layer, the core layer (Layer 2), and the second capping layer (Layer 1). The material of the first and second capping layers is $SiN_x$. The material of the core layer is $Y_2C_3$ (1$^{st}$ comparative example), $Y_3C_4$ (2$^{nd}$ comparative example), $Y_4C_7$, (3$^{rd}$ comparative example), and $YC_3$ (4$^{th}$ comparative example).

That is, in the first to fourth comparative examples, yttrium carbide was used as the material of the core layer, but yttrium carbide ($Y_2C_3$, $Y_3C_4$, $Y_4C_7$, $YC_3$) outside the range of $YC_x$ in which the atomic percentage of carbon is within a range of 25% to 45% according to the present disclosure was used.

When the thickness of the first capping layer is 5 nm, the transmittance and reflectance of the pellicle in an extreme ultraviolet output environment of 350 W were simulated in the first to fourth comparative examples while changing the thickness of the core layer to 0 to 50 nm and the thickness of the second capping layer to 0 to 5 nm.

First Comparative Example

Figure 10:
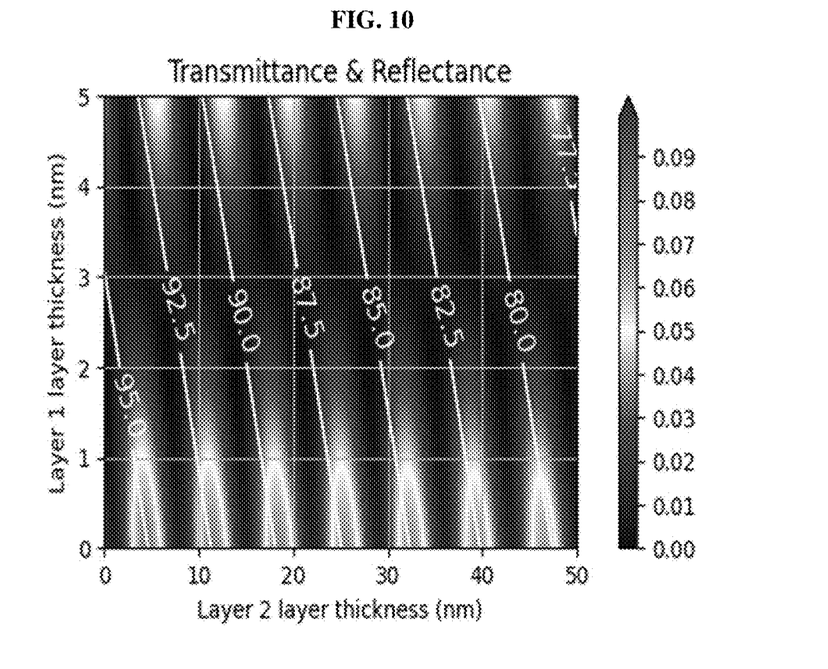
FIG. 10 is a graph showing transmittance and reflectance of a pellicle for extreme ultraviolet lithography based on yttrium carbide according to a first comparative example.

FIG. 10 is a graph showing transmittance and reflectance of a pellicle for extreme ultraviolet lithography based on yttrium carbide according to a first comparative example.

Referring to FIG. 10, it can be seen that the pellicle according to the first comparative example has a transmittance of 90% or more and a reflectance of 0.04% or less under the following conditions.

That is, when the thickness of the core layer is 15 nm or less and the thickness of the second capping layer is 2 to 4 nm, it can be seen that the transmittance is 90% or more and the reflectance is 0.04% or less.

Second Comparative Example

Figure 11:
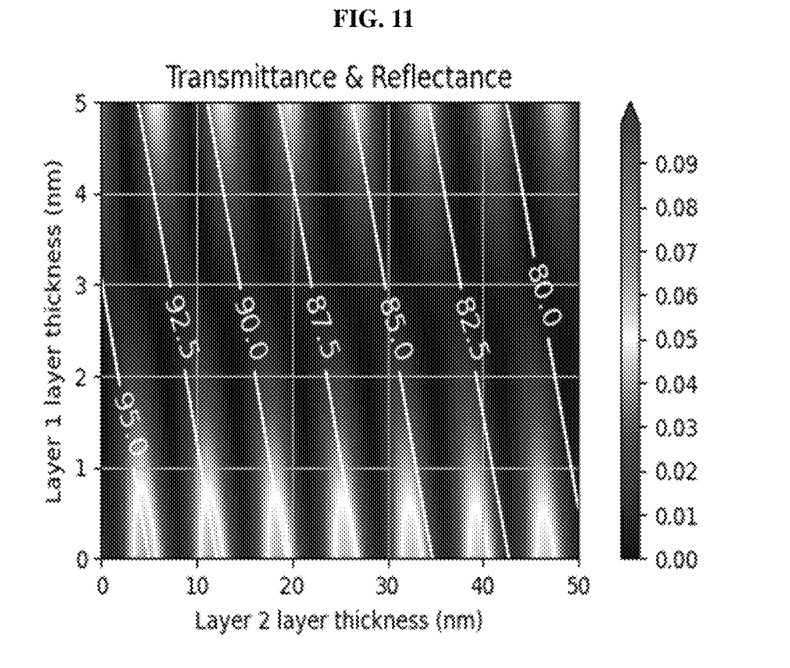
FIG. 11 is a graph showing transmittance and reflectance of a pellicle for extreme ultraviolet lithography based on yttrium carbide according to a second comparative example.

FIG. 11 is a graph showing transmittance and reflectance of a pellicle for extreme ultraviolet lithography based on yttrium carbide according to a second comparative example.

Referring to FIG. 11, it can be seen that the pellicle according to the second comparative example has a transmittance of 90% or more and a reflectance of 0.04% or less under the following conditions.

That is, when the thickness of the core layer is 16 nm or less and the thickness of the second capping layer is 2 to 4 nm, it can be seen that the transmittance is 90% or more and the reflectance is 0.04% or less.

Third Comparative Example

Figure 12:
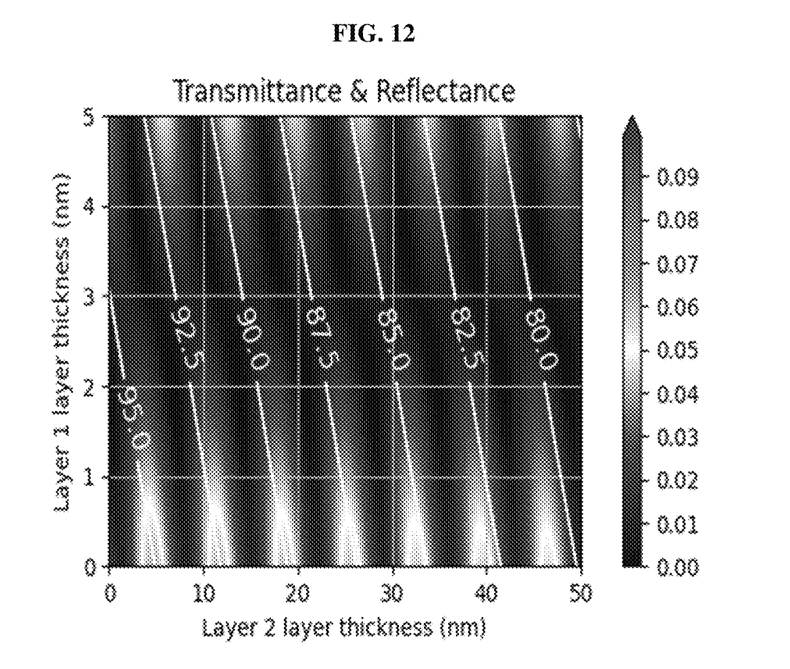
FIG. 12 is a graph showing transmittance and reflectance of a pellicle for extreme ultraviolet lithography based on yttrium carbide according to a third comparative example.

FIG. 12 is a graph showing transmittance and reflectance of a pellicle for extreme ultraviolet lithography based on yttrium carbide according to a third comparative example.

Referring to FIG. 12, it can be seen that the pellicle according to the third comparative example has a transmittance of 90% or more and a reflectance of 0.04% or less under the following conditions.

That is, when the thickness of the core layer is 16 nm or less and the thickness of the second capping layer is 2 to 4 nm, it can be seen that the transmittance is 90% or more and the reflectance is 0.04% or less.

Fourth Comparative Example

Figure 13:
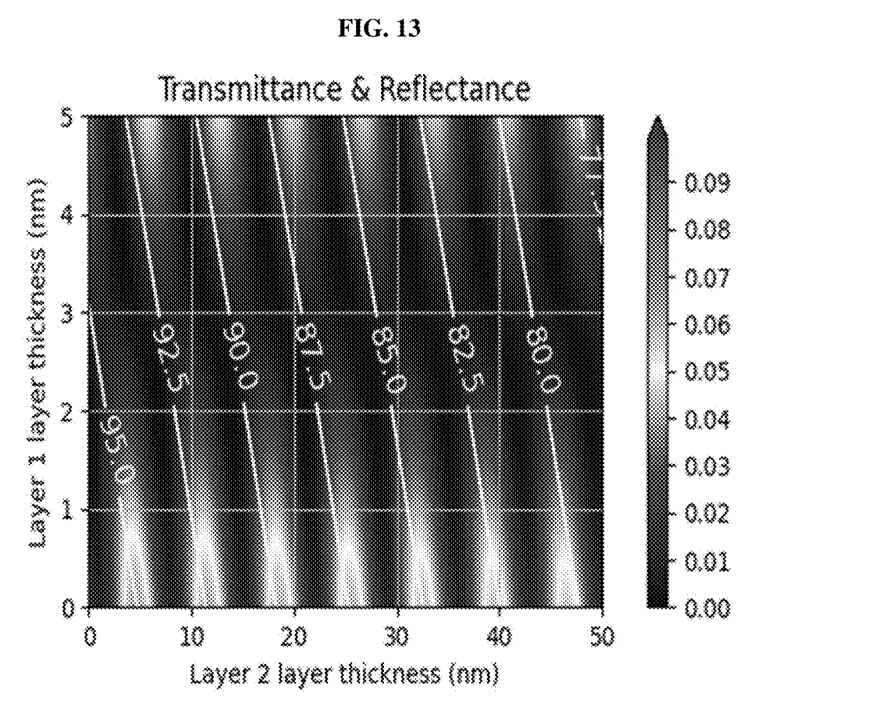
FIG. 13 is a graph showing transmittance and reflectance of a pellicle for extreme ultraviolet lithography based on yttrium carbide according to a fourth comparative example.

FIG. 13 is a graph showing transmittance and reflectance of a pellicle for extreme ultraviolet lithography based on yttrium carbide according to a fourth comparative example.

Referring to FIG. 13, it can be seen that the pellicle according to the fourth comparative example has a transmittance of 90% or more and a reflectance of 0.04% or less under the following conditions.

That is, when the thickness of the core layer is 15 nm or less and the thickness of the second capping layer is 2 to 4 nm, it can be seen that the transmittance is 90% or more and the reflectance is 0.04% or less.

As such, it can be seen that, in the pellicles according to the first to fourth comparative examples as well, there exist thicknesses of the core layer and the first and second capping layers satisfying the conditions of transmittance of 90% or more and reflectance of 0.04% or less.

However, because of having to form the thickness of the core layer to be 16 nm or less and also form the thickness of the second capping layer to be 4 nm or less, it is not easy to actually apply such pellicles.

In addition, when comparing the extreme ultraviolet transmittance in the pellicle having the core layer of the same thickness, it can be seen that the extreme ultraviolet transmittance is higher in the experimental examples than in the comparative examples.

Moreover, when comparing the extreme ultraviolet transmittance of 90% or more, it can be confirmed that the thickness of the core layer is 33 nm or less in the experimental examples and is 18 nm or less in the comparative examples. That is, according to the experimental examples, even when the core layer is thickly formed in consideration of mechanical stability, it is possible to realize an extreme ultraviolet transmittance of 90% or more.

As a result, it can be confirmed that the experimental examples have superior optical properties than the comparative examples.

While the present disclosure has been particularly shown and described with reference to an exemplary embodiment thereof, it will be understood by those skilled in the art that various changes in form and details may be made therein without departing from the scope of the present disclosure as defined by the appended claims.

What is claimed is:

1. A pellicle for extreme ultraviolet lithography, comprising:
   a pellicle layer including a core layer containing yttrium carbide, and a capping layer formed over one or both surfaces of the core layer; and
   a substrate configured to support the pellicle layer,
   wherein the yttrium carbide is $YC_x$ in which an atomic percentage of carbon is within a range of 25% to 45%.

2. The pellicle of claim 1, wherein the yttrium carbide includes $Y_2C$.

3. The pellicle of claim 1, wherein the yttrium carbide includes $\gamma\text{-}YC_x$ exhibiting a stable phase of $Y_2C$ as a temperature increases.

4. The pellicle of claim 1, wherein the yttrium carbide is $YC_x$ in which the atomic percentage of carbon is within a range of 29% to 34%.

5. The pellicle of claim 1, wherein the pellicle layer further includes:
   wherein the capping layer includes at least one of $Y_2C$, Y, Si, Ru, C, B, N, or O.

6. The pellicle of claim 5, wherein the capping layer includes $YC_xSi_y$ (x+y≥0.5), $YC_x B_y$ (x+y≥1), $YSi_xN_y$ (x+y≥1), $YC_xN_y$ (x+y≥1), $YC_x$ (x≥0.5), $YB_x$ (x≥1), $YSi_x$ (x≥0.5), $YN_x$ (x≥1), $SiN_x$ (x≥1), $SiO_2$, $B_4C$, or Ru.

7. The pellicle of claim 5, wherein the capping layer comprises a Y-α material, and has a composition different from a composition of the core layer, and wherein α is at least one of Si, Ru, C, B, N, or O.

8. The pellicle of claim 1, wherein the pellicle layer further includes:
   an intermediate layer formed on one or both surfaces of the core layer; and
   a capping layer formed on the intermediate layer,
   wherein each of the intermediate layer and the capping layer includes at least one of $Y_2C$, Y, Si, Ru, C, B, N, or O.

9. The pellicle of claim 8, wherein each of the intermediate layer and the capping layer includes $YC_xSi_y$ (x+y≥0.5), $YC_x B_y$ (x+y≥1), $YSi_xN_y$ (x+y≥1), $YC_x N_y$ (x+y≥1), $YC_x$ (x≥0.5), $YB_x$ (x≥1), $YSi_x$ (x≥0.5), $YN_x$ (x≥1), $SiN_x$ (x≥1), $SiO_2$, $B_4C$, or Ru.

10. The pellicle of claim 8, wherein each of the intermediate layer and the capping layer comprises a Y-α material, and has a composition different from a composition of the core layer, and wherein α is at least one of Si, Ru, C, B, N, or O.

11. A pellicle for extreme ultraviolet lithography, comprising:
    a substrate having an opening formed in a central portion thereof; and
    a pellicle layer formed over the substrate to cover the opening and including a core layer containing yttrium carbide and a capping layer formed over one or both surfaces of the core layer,
    wherein the yttrium carbide is $YC_x$ in which an atomic percentage of carbon is within a range of 25% to 45%.

12. The pellicle of claim 11, wherein the yttrium carbide includes $Y_2C$.

13. The pellicle of claim 11, wherein the yttrium carbide includes $\gamma\text{-}YC_x$ exhibiting a stable phase of $Y_2C$ as a temperature increases.

14. The pellicle of claim 11, wherein the yttrium carbide is $YC_x$ in which the atomic percentage of carbon is within a range of 29% to 34%.

15. The pellicle of claim 11, wherein the pellicle layer further includes:
    wherein the capping layer includes at least one of $Y_2C$, Y, Si, Ru, C, B, N, or O.

16. The pellicle of claim 15, wherein the capping layer includes $YC_xSi_y$ (x+y≥0.5), $YC_x B_y$ (x+y≥1), $YSi_xN_y$ (x+y≥1), $YC_xN_y$ (x+y≥1), $YC_x$ (x≥0.5), $YB_x$ (x≥1), $YSi_x$ (x≥0.5), $YN_x$ (x≥1), $SiN_x$ (x≥1), $SiO_2$, $B_4C$, or Ru.

17. The pellicle of claim 15, wherein the capping layer comprises a Y-α material, and has a composition different from a composition of the core layer, and wherein α is at least one of Si, Ru, C, B, N, or O.

18. The pellicle of claim 11, wherein the pellicle layer further includes:
    an intermediate layer formed on one or both surfaces of the core layer; and
    a capping layer formed on the intermediate layer,
    wherein each of the intermediate layer and the capping layer includes at least one of $Y_2C$, Y, Si, Ru, C, B, N, or O.

19. The pellicle of claim 18, wherein each of the intermediate layer and the capping layer includes $YC_xSi_y$ (x+y≥0.5), $YC_x B_y$ (x+y≥1), $YSi_xN_y$ (x+y≥1), $YC_x N_y$ (x+y≥1), $YC_x$ (x≥0.5), $YB_x$ (x≥1), $YSi_x$ (x≥0.5), $YN_x$ (x≥1), $SiN_x$ (x≥1), $SiO_2$, $B_4C$, or Ru.

20. The pellicle of claim 18, wherein each of the intermediate layer and the capping layer comprises a Y-α material, and has a composition different from a composition of the core layer, and wherein α is at least one of Si, Ru, C, B, N, or O).

\* \* \* \* \*